US012003146B2

(12) United States Patent
McDonald et al.

(10) Patent No.: US 12,003,146 B2
(45) Date of Patent: Jun. 4, 2024

(54) CASCADE MOSFET DESIGN FOR VARIABLE TORQUE GENERATOR/MOTOR GEAR SWITCHING

(71) Applicant: Falcon Power, LLC, Titusville, FL (US)

(72) Inventors: Harley C. McDonald, Merritt Island, FL (US); James L. Bailey, Titusville, FL (US); Matthew C. McDonald, Merritt Island, FL (US)

(73) Assignee: Falcon Power, LLC, Titusville, FL (US)

( * ) Notice: Subject to any disclaimer, the term of this patent is extended or adjusted under 35 U.S.C. 154(b) by 0 days.

(21) Appl. No.: 17/190,354

(22) Filed: Mar. 2, 2021

(65) Prior Publication Data

US 2021/0273531 A1 Sep. 2, 2021

Related U.S. Application Data

(60) Provisional application No. 63/077,243, filed on Sep. 11, 2020, provisional application No. 62/984,270, filed on Mar. 2, 2020.

(51) Int. Cl.
*H02K 11/28* (2016.01)
*H02K 1/16* (2006.01)
(Continued)

(52) U.S. Cl.
CPC ............. *H02K 11/28* (2016.01); *H02K 1/16* (2013.01); *H02K 1/20* (2013.01); *H02K 3/24* (2013.01);
(Continued)

(58) Field of Classification Search
CPC ..... G06F 1/00; G06F 1/08; G06F 7/00; G06F 7/68; H02K 1/00; H02K 1/16; H02K 1/20;
(Continued)

(56) References Cited

U.S. PATENT DOCUMENTS 2,243,616 A 5/1941 Julius et al.
2,475,169 A 7/1949 Zahn
(Continued)

FOREIGN PATENT DOCUMENTS

DE 4411055 A1 8/1995
DE 102015220852 A1 4/2017
(Continued)

OTHER PUBLICATIONS

Jim Davis, Hot-swap controllers: A programmable approach, Feb. 8, 2011, EE Times, www.eetimes.com/hot-swap-controllers-a-programmable-approach/ accessed Jul. 27, 2023 (Year: 2011).*
(Continued)

*Primary Examiner* — Thomas J. Hiltunen
(74) *Attorney, Agent, or Firm* — Kevin E. West; Advent, LLP (57) ABSTRACT

A cascade MosFet circuit design for variable gear switching using pulse width modulation (PWM) between electronic gears to achieve a smooth transition is disclosed. In an embodiment, in the system, there can be three separate stages of two or more switches from very low amperage to hundreds of amps that can be automatically selected within a chosen stage. The automatic switching can be programmed to be power (e.g., current) sensitive or can be both power and electronic gear sensitive as to cascade into the right MosFet combination for different gear settings and still select greater values for varying power levels. Such a smooth transition can allow the generator or motor using such cascade MosFet circuit design to operate more efficiently and/or more quietly.

14 Claims, 7 Drawing Sheets

(51) Int. Cl.
| | |
|---|---|
| H02K 1/20 | (2006.01) |
| H02K 3/24 | (2006.01) |
| H02K 5/20 | (2006.01) |
| H02K 9/197 | (2006.01) |
| H02K 29/03 | (2006.01) |
| H03K 3/011 | (2006.01) |
| H03K 17/687 | (2006.01) |
| H05K 7/20 | (2006.01) |
| H02K 5/10 | (2006.01) |

(52) U.S. Cl.
CPC .............. *H02K 5/20* (2013.01); *H02K 9/197* (2013.01); *H02K 29/03* (2013.01); *H03K 3/011* (2013.01); *H03K 17/6871* (2013.01); *H05K 7/209* (2013.01); *H02K 5/10* (2013.01); *H02K 2213/03* (2013.01)

(58) Field of Classification Search
CPC ........ H02K 1/278; H02K 11/00; H02K 11/28; H02K 2213/00; H02K 2213/03; H02K 29/00; H02K 29/03; H02K 3/00; H02K 3/24; H02K 5/00; H02K 5/10; H02K 5/20; H02K 9/00; H02K 9/197; H03K 17/00; H03K 17/6871; H03K 17/785; H03K 23/00; H03K 23/667; H03K 23/68; H03K 3/00; H03K 3/011; H03K 5/00; H03K 5/00006; H05K 7/00; H05K 7/209
USPC ........................................................ 307/115
See application file for complete search history.

(56) References Cited

U.S. PATENT DOCUMENTS

| | | | |
|---|---|---|---|
| 2,828,955 | A | 4/1958 | Murray |
| 3,675,170 | A | 7/1972 | Wellman, Jr. |
| 3,836,802 | A | 9/1974 | Parker |
| 4,207,773 | A | 6/1980 | Stahovic |
| 5,855,256 | A | 1/1999 | Kuwahara |
| 7,159,851 | B1* | 1/2007 | Ross ................ B66D 3/18 |
| | | | 254/378 |
| 7,453,341 | B1 | 11/2008 | Hildenbrand |
| 7,821,753 | B2* | 10/2010 | Evans ................ H02H 9/001 |
| | | | 361/90 |
| 9,593,753 | B2 | 3/2017 | Davey et al. |
| 9,654,035 | B1* | 5/2017 | Cieslewski ........... H02P 27/08 |
| 9,921,330 | B2* | 3/2018 | Berglund ............ H01H 9/548 |
| 10,320,272 | B1 | 6/2019 | Juarez |
| 10,418,899 | B2* | 9/2019 | Lui .................... H03K 17/164 |
| 11,094,807 | B2* | 8/2021 | Cattani ................. H02M 1/32 |
| 11,114,855 | B2* | 9/2021 | Handelsman ........... H02J 3/14 |
| 11,251,622 | B1* | 2/2022 | Sherwood ........... H02M 1/088 |
| 11,264,157 | B2 | 3/2022 | Choi |
| 11,368,100 | B2* | 6/2022 | Danforth, III ....... H02M 5/293 |
| 2004/0183510 | A1* | 9/2004 | Sutardja ............. H03K 17/122 |
| | | | 323/266 |
| 2005/0140231 | A1 | 6/2005 | Ogoshi |
| 2010/0270804 | A1 | 10/2010 | Datel |
| 2013/0019917 | A1 | 1/2013 | Pal |
| 2013/0049509 | A1 | 2/2013 | Shin |
| 2013/0175894 | A1 | 7/2013 | Chen |
| 2013/0207488 | A1 | 8/2013 | Labbe et al. |
| 2013/0234779 | A1 | 9/2013 | Klug, Jr. |
| 2013/0342057 | A1 | 12/2013 | Fried |
| 2014/0035412 | A1 | 2/2014 | Brewster et al. |
| 2014/0070675 | A1 | 3/2014 | Linnebjerg |
| 2014/0117949 | A1* | 5/2014 | Sadwick ............... H02M 5/293 |
| | | | 323/239 |
| 2014/0313557 | A1 | 10/2014 | Brown et al. |
| 2014/0354089 | A1 | 12/2014 | Chamberlin et al. |
| 2015/0048705 | A1 | 2/2015 | Davey et al. |
| 2015/0061437 | A1 | 3/2015 | Hudec |
| 2015/0318851 | A1 | 11/2015 | Roberts et al. |
| 2016/0005519 | A1 | 1/2016 | Choi |
| 2016/0019917 | A1 | 1/2016 | Du et al. |
| 2016/0036308 | A1 | 2/2016 | Bailey et al. |
| 2016/0164378 | A1 | 6/2016 | Gauthier et al. |
| 2016/0301339 | A1 | 10/2016 | Ito |
| 2017/0160540 | A1 | 6/2017 | Giusti et al. |
| 2017/0271954 | A1 | 9/2017 | Hanumalagutti et al. |
| 2018/0048255 | A1 | 2/2018 | Marvin et al. |
| 2018/0205303 | A1 | 7/2018 | Del Curto |
| 2018/0261412 | A1* | 9/2018 | Schaper .................. H02P 3/18 |
| 2019/0158000 | A1 | 5/2019 | Oelofse |
| 2020/0007000 | A1 | 1/2020 | Berendes et al. |

FOREIGN PATENT DOCUMENTS

| | | |
|---|---|---|
| JP | 2005045984 A | 2/2005 |
| KR | 20080070161 A | 7/2008 |
| KR | 20090049188 A | 5/2009 |
| KR | 20120056623 A | 6/2012 |
| KR | 20120067855 A | 6/2012 |
| KR | 20170060055 A | 5/2017 |
| KR | 20180004139 A | 1/2018 |
| WO | 2009137326 A1 | 11/2009 |
| WO | 2011099603 A1 | 8/2011 |
| WO | 2015126981 A1 | 8/2015 |
| WO | 2017018578 A1 | 2/2017 |

OTHER PUBLICATIONS

PCT International Search Report and Written Opinion for PCT/US2021/020558, dated Jun. 24, 2021.
PCT International Search Report and Written Opinion for PCT/US2021/020562, dated Jun. 28, 2021.
PCT International Search Report and Written Opinion for PCT/US2021/010008, dated Jun. 29, 2021.
PCT International Search Report and Written Opinion for PCT/US2021/020559, dated Jun. 29, 2021.
PCT International Search Report and Written Opinion for PCT/US2021/010006, dated Jun. 28, 2021.
Matsui, N., "Design and Control of Variable Field Permanent Magnet Motors," IEEJ Transactions on Electrical and Electronic Engineering, IEEJ Trans 2019, 14, pp. 966-981.

* cited by examiner

CASCADE MOSFET DESIGN FOR VARIABLE TORQUE GENERATOR/MOTOR GEAR SWITCHING

CROSS-REFERENCE TO RELATED APPLICATIONS

The present application claims priority under 35 U.S.C. § 119(e) of U.S. Provisional Application Ser. No. 62/984,270, filed Mar. 2, 2020, and titled "Variable Torque Generation Electric Machine Employing Tunable Halbach Magnet Array." The present application claims priority under 35 U.S.C. § 119(e) of U.S. Provisional Application Ser. No. 63/077,243, filed Sep. 11, 2020, and titled "Cascade Mosfet Design for Variable Torque Generator/Motor Gear Switching." The co-pending Non-Provisional application Ser. No. 17/190,347 titled "Cooling System for Variable Torque Generation Electric Machine" dated Mar. 2, 2021 is incorporated by reference herein in its entirety. The co-pending Non-Provisional application Ser. No. 17/190,362 titled "Variable Torque Generation Electric Machine Employing Tunable Halbach Magnet Array" dated Mar. 2, 2021 is incorporated by reference herein in its entirety.

BACKGROUND

Electric machines are devices that use electromagnetic forces to convert electrical energy to mechanical energy or mechanical energy to electrical energy. Common electric machines include electric generators and electric motors.

Electric generators convert mechanical energy into electrical energy for use in an external circuit such as a power grid, an electrical system in a vehicle, and so forth. Most generators employ a motive power source in the form of a rotary force (torque) such as the rotation of a shaft. The rotary force causes an electric current to be generated in one or more wire windings through interaction between magnetic fields created by magnets within the generator and the wire windings. Common sources of motive power include steam turbines, gas turbines, hydroelectric turbines, internal combustion engines, and the like, which have a constant torque and continuous rotational speed, expressed in Revolutions Per Minute (RPM).

Electric motors are mechanically identical to electric generators but operate in reverse. Electric motors convert electrical energy into mechanical energy through the interaction between magnetic fields created by magnets within the motor and electric current passing through one or more wire windings to generate a motive force in the form of rotation of the motor's shaft (i.e., a rotary force or torque). This rotary force (torque) is then used to propel some external mechanism. Electric motors are generally designed to provide continuous rotation and constant torque. In certain applications, such as in vehicles employing regenerative braking with traction motors, electric motors can be used in reverse as generators to recover energy that might otherwise be lost as heat and friction.

Increasingly, electric generators employed in renewable energy technologies must operate at rotational speeds (RPM) and torques that vary widely because the power sources used are variable, untimely, and often unpredictable. Similarly, electric motors employed by environmentally friendly or green technologies must be capable of producing a range of rotational speeds (RPM) and torques. However, while conventional electric generators and motors often demonstrate efficiencies ranging from ninety to ninety-eight percent (90%-98%) when operating near their rated rotational speed (RPM)) and torque, the efficiencies of these same generators and motors decreases dramatically, often as low as thirty to sixty percent (30%-60%) when they are operating outside of their rated rotational speed (RPM) and/or torque.

Alternatively, induction motors can vary the magnetic field of the rotor; however, this ability comes at the cost of additional electricity usage, weight, and inefficiency. Furthermore, some electric motors can be operated both above and below their rated RPM using "Variable Frequency Drives," but such systems operate with much lower performance and efficiency.

In transportation, the moving of goods and people from one point to another requires significant starting, stopping, and speed variations. Linear motors are most often used for moving goods and/or people from one point to another. Permanent magnets are attractive for linear motors in that external power only needs to be supplied to the stationary or stator side of the linear motor, simplifying the construction and greatly increasing the range of efficiency in speed and pull; however, permanent magnet linear motors are still limited in their efficiency range, and in situations where the transport is coasting in transit such that power is not being delivered to the linear motor, the motor experiences back electromagnetic fields (EMF) and extreme drag due to the phenomenon known as Lenz's Law where the passing permanent magnet experiences resistance to its relative motion to the iron core of the stator due to induced eddy currents produced in the iron core by the passing magnet.

DRAWINGS

The Detailed Description is described with reference to the accompanying figures. The use of the same reference numbers in different instances in the description and the figures may indicate similar or identical items. Additionally, it will be appreciated by those of ordinary skill in the art that the concepts disclosed herein may be applied to various kinds of electric machines including, but not limited to, electric motors, electric generators, and/or electromechanical transmission systems. Thus, throughout this disclosure and in the claims that follow, the term electric machine is used generally to describe any electromechanical device capable of employing the concepts described herein, and it should be appreciated that, unless otherwise so stated, that the term electric machine may refer to an electric motor, an electric generator, a linear motor, and an electromechanical transmission system, combinations thereof (e.g., a motor/generator suitable for use in a hybrid vehicle employing regenerative braking), and so forth.

While the embodiments of the present application are susceptible to various modifications and alternative forms, specific embodiments thereof have been shown by way of example in the drawings and are herein described in detail. It should be understood, however, that the description herein of specific embodiments is not intended to limit the application to the particular embodiment disclosed, but on the contrary, the intention is to cover all modifications, equivalents, and alternatives falling within the spirit and scope of the process of the present application as defined by the appended claims.

DETAILED DESCRIPTION

Aspects of the disclosure are described more fully hereinafter with reference to the accompanying drawings, which form a part hereof, and which show, by way of illustration, example features. The features can, however, be embodied in many different forms and should not be construed as limited to the combinations set forth herein; rather, these combinations are provided so that this disclosure will be thorough and complete, and will fully convey the scope.

As used herein, "system" and "assembly" are used interchangeably. It should be noted that the articles "a," "an," and "the," as used in this specification, include plural referents unless the content clearly dictates otherwise. Additional features and functions are illustrated and discussed below.

Overview

The state of the art in permanent magnet electric motors and generators is that the magnetic field of the rotor is not adjustable, but is instead fixed. As a result, most motors and generators are designed for a specific speed and torque with a very narrow range of optimum efficiency. High torque requirements in a motor or generator require more powerful permanent magnets which in turn create a large back EMF that is in turn overcome with high voltage and amperage. When motor speed and torque are constant, the motor or generator can be designed for optimum efficiency at its design speed and torque. Often, this efficiency is above 90%. Thus, in the manufacture of these motors the stator core, core windings, and permanent magnets are all selected to act together in the most efficient manner possible to produce the selected design torque, rpm, and volt, amp ratios at an optimum or threshold efficiency. Once these key components are selected and placed in the motor or generator, they, under the present state of the art, cannot be changed. Only the power and speed of the driving force in a generator and the voltage and current of the electricity into a motor can be changed; however, when this same motor or generator is put in service where the speed and torque vary widely such as found in land vehicles and/or wind or water-powered generators, the back EMF of the fixed magnets must still be overcome when the speed and torque requirements are less than the maximum designed for and the stator wiring sufficient and appropriately sized when the speed and torque are greater than the maximum designed for. When they are not, the overall efficiency of the motor or generator can dramatically drop in many cases to as low as 20% for say rapid transit vehicles, automobiles, or wind/water-powered generators, and the like.

The present disclosure is directed to an electric generator and/or motor that is capable of operating with high-efficiency wide volt and amperage operating range and extremely variable torque and RPM conditions. The technology for such a generator or motor is referred to herein as Variable Torque Generation ("VTG"). With respect to generator functions, this disclosure can utilize the variability of renewable resources such as inconsistent wind speed, untimely ocean wave movement, or braking energy in a hybrid vehicle and more efficiently increases the generating potential that conventional generators cannot do. Concerning motor functions, the disclosure can produce a variable range of torque/RPM possibility to more efficiently meet the requirements of hybrid vehicles and other motor uses. The system can dynamically change the output power of the motor/generator, e.g., by varying the magnetic field induced in the stator by switching multiple non-twisted parallel coil wires in the stator between being connected in all series, all in parallel, or combinations thereof; by varying between star or delta configurations; by varying pole count; by correspondingly varying, adjusting, or focusing the magnetic field of the permanent magnets acting on the stator via tuning of a Halbach array (the co-pending Non-Provisional application Ser. No. 17/190,362 titled "Variable Torque Generation Electric Machine Employing Tunable Halbach Magnet Array" dated Mar. 2, 2021 is incorporated by reference herein in its entirety); and by modularly engaging and disengaging rotor/stator sets as power demands increase or decrease. As torque/RPM or amperage/voltage requirements change, the system can activate one stator or another (in multiple units connected to a common computer processor), change between parallel to series winding within the stator sets through sets of 2, 4, 6, or more parallel, three-phase, non-twisted coil windings, and change the stator pole count by a factor of 2 or more to yield multiple possible wiring combinations to meet the torque/RPM or amperage/voltage requirements to improve (e.g., optimize or nearly optimize) efficiency. Each wiring combination is herein referred to as a "Gear" and switching between wiring combinations as "Changing" or "Shifting" Gears, albeit they are electronic Gears. A cooling system can be employed to regulate temperatures as a result of electromechanical heating between the rotor/stator sets. The co-pending Non-Provisional application Ser. No. 17/190,347 titled "Cooling System for Variable Torque Generation Electric Machine" dated Mar. 2, 2021 is incorporated by reference herein in its entirety. The cooling system allows VTG to incrementally reduce the resistance of stator coils by shifting gears and significantly increase the amperage in the coils without incurring significant losses due to overheating. Cooling the wires will allow the wires to carry more amperage by as much as five times their rated capacity. In comparison to a conventional motor or generator with a single conductor per phase, a cooled conventional motor/generator may have its power increased through cooling by as much as five times, whereas the VTG motor or generator may have its power increased by as much as 30 times. If the temperature of the electric machine system is controlled, the temperature can be used as a variable for controlling a wire switching system.

In most motors when attempting to vary speed or torque, there can be a significant loss of efficiency in an off-the-shelf or standard controller when operating at speeds other than optimum. A standard controller typically cannot handle wide variations in power and speed efficiently. For that matter, a normal MosFet (i.e., shorthand notation for a metal-oxide-semiconductor field-effect transistor) or Triac switch cannot handle wide variations in amperage efficiently. For example, a 50 or 100 amp MosFet does not work well at 2 amps. In general, a MosFet is a popular version of a switch-mode power supply (SMPS) transistor. Historically, low-voltage (e.g., less than 250 V), low-current, and/or high switching frequencies (e.g., greater than 200 kHz) can be favorable for MosFet usage.

The present disclosure provides a cascade switching system or circuit design for switching between the different combinations of series/parallel wiring, star/delta wiring, pole count, and may include the use of pulse width modulation (PWM) between the "electronic" gears to achieve a smoother transition, all herein referred to as the Motor/Generator Transmission (MGT). In an embodiment, in the system, there can be three separate stages of two or more switches from very low amperage to high amperage (e.g., hundreds of amps) that can be automatically selected within a chosen stage. The automatic switching can be programmed to be current sensitive, temperature sensitive, or can be both current, temperature, and electronic gear sensitive as to cascade into the most appropriate MosFet combination for different gear settings and still select greater values for varying amperages. Such a smooth transition can allow the generator or motor using such cascade MosFet circuit design to operate more efficiently and/or more quietly. The term MosFet, as used herein, refers to the appropriate electronic switch for the purpose at hand, which can be MosFet, IGBT and/or Triac; however, Triac may not be used when PWM is employed.

The present system facilitates operation over a wide power (e.g., current) range. As used herein, "power" is known in the art as electrical power having the proportional relationship of the product of voltage and current in an electric circuit. The power can be monitored and the current directed to the appropriate size switch or a parallel combination of switches to handle the load, and, as the load increases (e.g., exceeding a given threshold), it can be directed through successively larger switches, each designed to handle more efficiently the applicable load. As used herein, "load" refers to inputted (in the case of a motor function) or outputted (in the case of a generator function) power of the MTG system.

Since electronic switches still nevertheless absorb energy, then a final stage of the switch operation can be an electromechanical switch having no losses such as a carbon switch, a relay switch, or a stepper motor switch. This circuit arrangement can be beneficial since, when switching between gears, there can be a large jolt in the power difference—pulse width modulation can be used while changing gears in combination with magnetic focusing of the permanent magnets to effectively and efficiently change from one gear to another.

Example Embodiments

Figure 1:
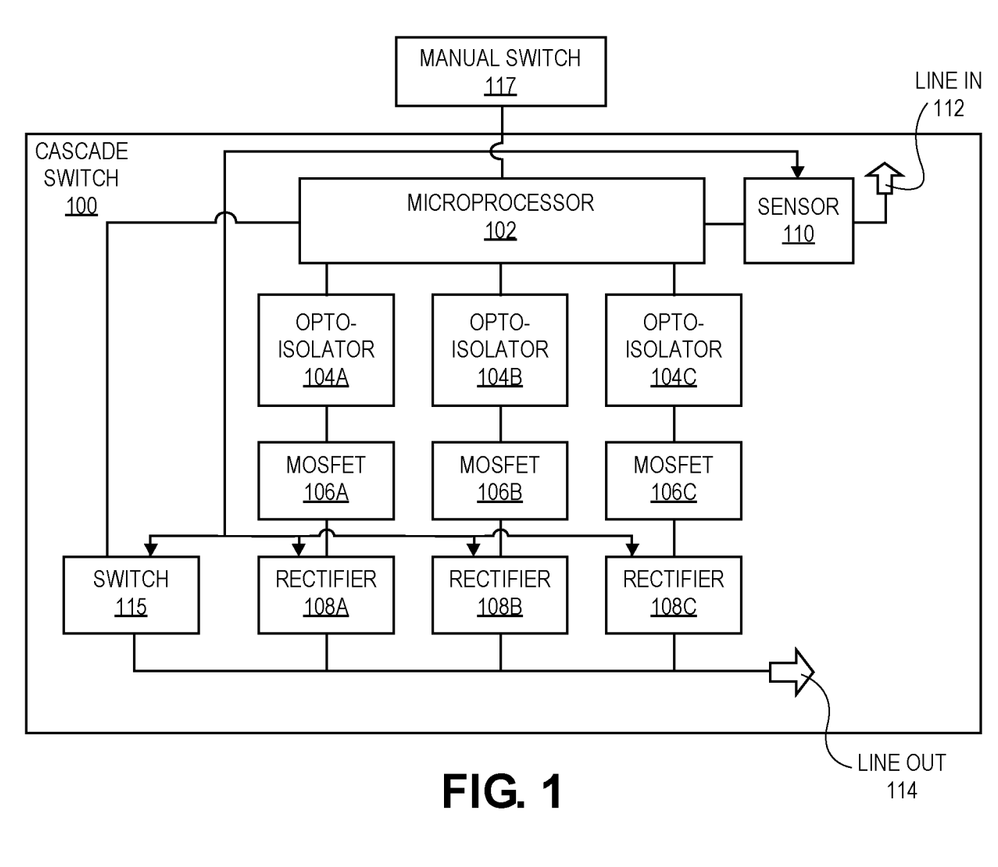
FIG. 1 is a schematic view of a cascade MosFet switch, in accordance with an embodiment of the present disclosure.
Figure 2:
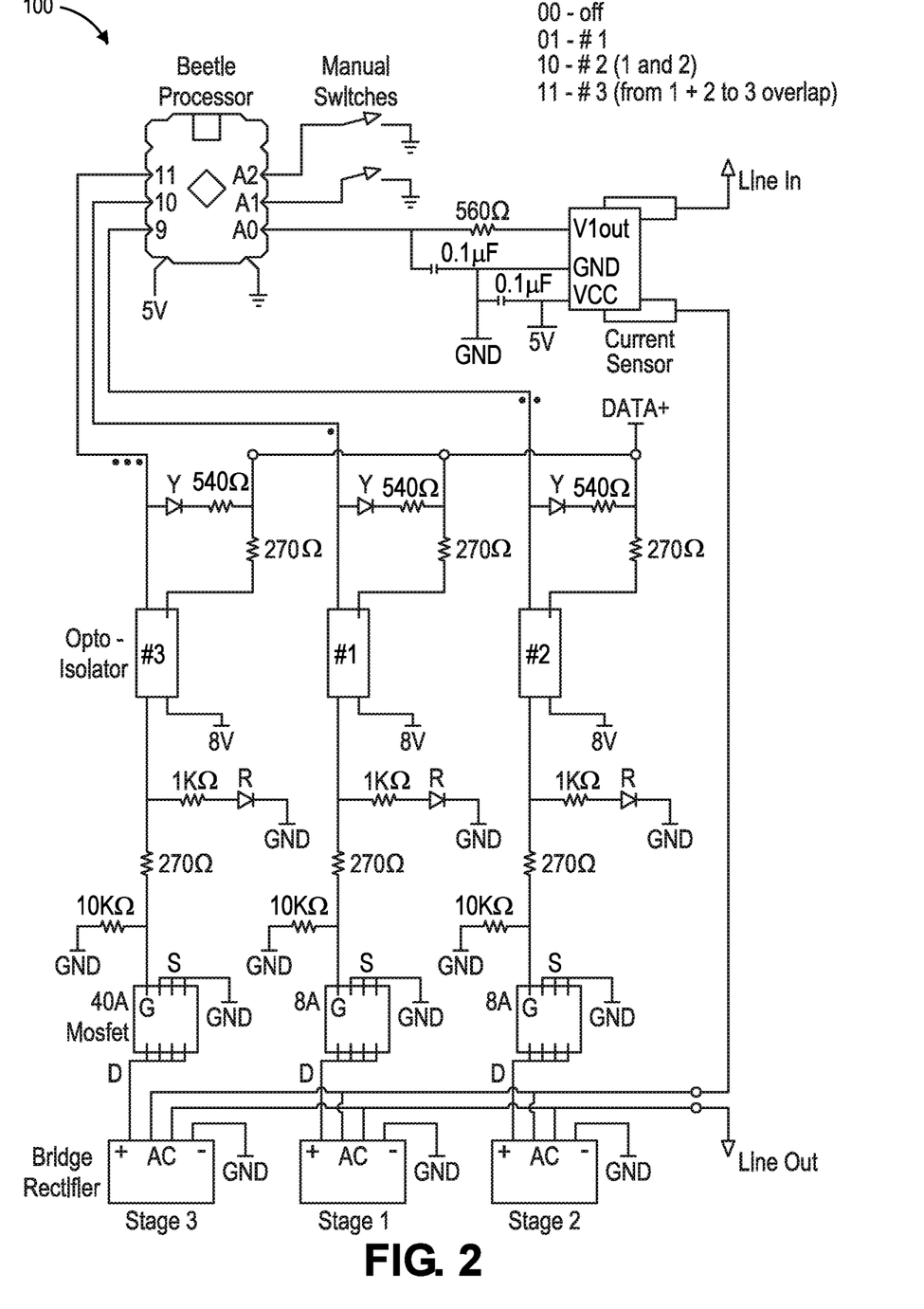
FIG. 2 is a detailed schematic view of a cascade MosFet switch, in accordance with an embodiment of the present disclosure.

FIG. 1 schematically illustrates a cascade MosFet switch 100 (hereinafter also referred to as a "cascade switch 100"), in accordance with an embodiment of the present disclosure. FIG. 2 schematically illustrates a more detailed embodiment of the cascade switch 100 shown in FIG. 1. The cascade switch 100 can include a microprocessor 102, a plurality of switch circuits (e.g., A-C in the illustrated embodiment), a sensor 110, a line in 112, and a line out 114. Each switch circuit A-C can respectively include an opto-isolator (104A, 104B, 104C), a MosFet switch (106A, 106B, 106C), and a rectifier (108A, 108B, 108C), communicatively connected in that general order. The microprocessor 102 can be, but is not limited to, an Arduino Pro Mini or an Arduino Beetle microcontroller, and can be programmed and configured to automatically switch or cascade between the switch circuits A-C (e.g., with switch circuits A and B being 10-amp circuits; and switch circuit C being a 100-amp circuit). While the preferred embodiment employs an Arduino Pro Mini or an Arduino Beetle microcontroller, it should be understood that alternative microcontrollers, microprocessors, or any other logic control circuitry capable of being programmed and configured are also contemplated.

In an embodiment, at least one of the switch circuits A-C (e.g., switch circuit C) can accommodate a higher power level than at least one of the other switch circuits A-C. As such, the cascade circuit 100 can be arranged such that microprocessor 102 can direct power flow to a switch circuit C as the power requirements increase (e.g., a gear level is activated and/or a motor/generator speed is increased). The power can be monitored by the microprocessor 102, and the current directed to the appropriate size switch A-C or a parallel combination of switches (e.g., A, B) to handle the load. Particularly, as the load increases (e.g., exceeding a given threshold), the power/current can be directed through successively larger switches (e.g., a 100-amp switch instead of one or more 10-amp switches), each designed to handle more efficiently the applicable load. In an embodiment, the microprocessor 102 is configured to use pulse width modulation when transitioning the electrical load between the plurality of switch circuits A-C. In an embodiment, the cascade switch 100 is configured to direct the load to the operation of an MGT (e.g., a selected gear thereof).

By way of example, by operating the first switch circuit A with setting at 10 amps, it is possible to select all operations from 0 to 6 amps or another range of 0 to 10 amps (e.g., up to 7-9 amps) and then select the second 10-amp switch circuit B to operate in parallel with the first for a combined 20 amp max. After exceeding 18 amps, for example, the microprocessor 100 can be configured to select to use only the 100-amp switch circuit C and disengage the two 10-amp circuit switches A, B, so as to not overload them, thereby having a maximum amperage of 100 amps. It is to be understood that another combined amperage of 20 or less between the two switch circuits A, B, may be chosen as a trigger point for use of the 100-amp switch circuit C and be within the scope of the present disclosure. The use of the two lower amperage switches A, B can permit the cascade switch 100 to be more responsive in lower amperage ranges (e.g., 0-20), permitting smoother gear transitions in lower gear/torque ranges.

In order to protect the microprocessor 102 and stop power supply feedback in the switching circuit, opto-isolators (104A, 104B, 104C) can be employed that send the switching signal to the high power MosFet switches (106A, 106B, 106C) to safely operate. An opto-isolator (104A, 104B, 104C) can also be called an optocoupler, photocoupler, or optical isolator and is an electronic component that is configured to transfer electrical signals between two isolated circuits by using light. Opto-isolators can prevent high voltages from affecting the system receiving the signal. A corresponding ground isolated DC to DC converter (shown in FIG. 2 but not labeled) can be used for the charge pump power circuit A-C in getting the gate (e.g., at MosFet switches (106A, 106B, 106C)) to switch fully. A given switch circuit A-C, in one example, can operate at five (5) volts, and the high power switches can operate on nine (9) volts and can use a separate grounding system from the microprocessor 102 to avoid feedback shorts.

In an embodiment, the switch circuit or unit (i.e., cascade switch 100) can utilize a single MosFet (106A, 106B, 106C) and a single corresponding bridge rectifier (108A, 108B, 108C) per a respective switch circuit A-C to enable the switching of both alternating-current (AC) and direct-current (DC) voltages up to 600 volts and selectable from 0 to 100 amps. In an embodiment, a bridge rectifier (108A, 108B, 108C) can include an arrangement of four or more diodes (not individually illustrated) in a bridge circuit configuration that facilitates conversion between AC DC. This switch unit 100, via the switch circuits A-C, can also handle the widely variable frequencies that this motor/generator can produce, including the ability to pulse width modulate (PWM) both DC and AC power systems.

In an embodiment, it is possible to use dual MosFets or insulated-gate bipolar transistors (IGBTs) as a switch instead of a single one coupled to a bridge rectifier (108A, 108B, 108C) to achieve an optimal low switching resistance and a lowest voltage drop. An IGBT is a three-terminal power semiconductor device primarily used as an electronic switch that typically combines high efficiency and fast switching. In an embodiment, it may be possible to remove a bridge rectifier and still be able to switch both AC and DC inputs from the controller, with components sourced to provide the best combination of low resistance and lowest voltage drop across the circuit. In an embodiment, the microprocessor 102 can be in communication with manual switch 117, for example, manual switch 117 may comprise of one or more user-operated switches (shown in FIG. 2, but not labeled) to enable the overriding of the automatic system 100 based on a selection of the one or more user-operated switches and thereby permit the user to switch manually the MosFet configuration A-C employed for testing or other operations. The line in 112 and the line out 114 are configured to facilitate electrical/electronic coupling of the cascade switch 100 with a switch controller 1000 (FIGS. 3 and 4) and, ultimately, with an MGT (not shown). Per the illustrated embodiment, the line in 112 can be coupled to the microprocessor 102, and the line out 114 can be coupled to the rectifiers 108A-108C.

A sensor 110 can further be electronically coupled between the microprocessor 102 and the line in 112. In an embodiment, the sensor 110 can be a temperature sensor (e.g., a thermocouple, a thermistor, a resistance temperature detector (RTD), or a semiconductor-based sensor). The temperature sensor 110 can test the operating temperature of a given cascade switch 100 to determine if it is getting too hot (e.g., reaching limits of heat dissipation) and, thus, if a larger switch set (e.g., capable of handling higher amperages) needs to be employed. As such, the measured temperature and/or the measured amperage within a given cascade switch 100 can be used to determine when to employ a different combination of switch circuits A-C within the given cascade switch 100 and/or whether to employ another cascade switch/switch combination (separately or in combination with the currently employed one).

In an embodiment, the sensor 110 can be a current sensor. The current sensor can be configured to measure a current, for example, up to 100 amps, and to send a signal of the actual current in the form of a voltage output to the microprocessor 102. The signal of the actual current can enable the setting of limits of operation and the control of the switch circuits A-C or sets of switch circuits A-C that need to be used in accordance with the amperage being used or consumed. In an embodiment, a plurality of sensors 110 can be used (e.g., a current sensor and a temperature sensor).

Figure 3:
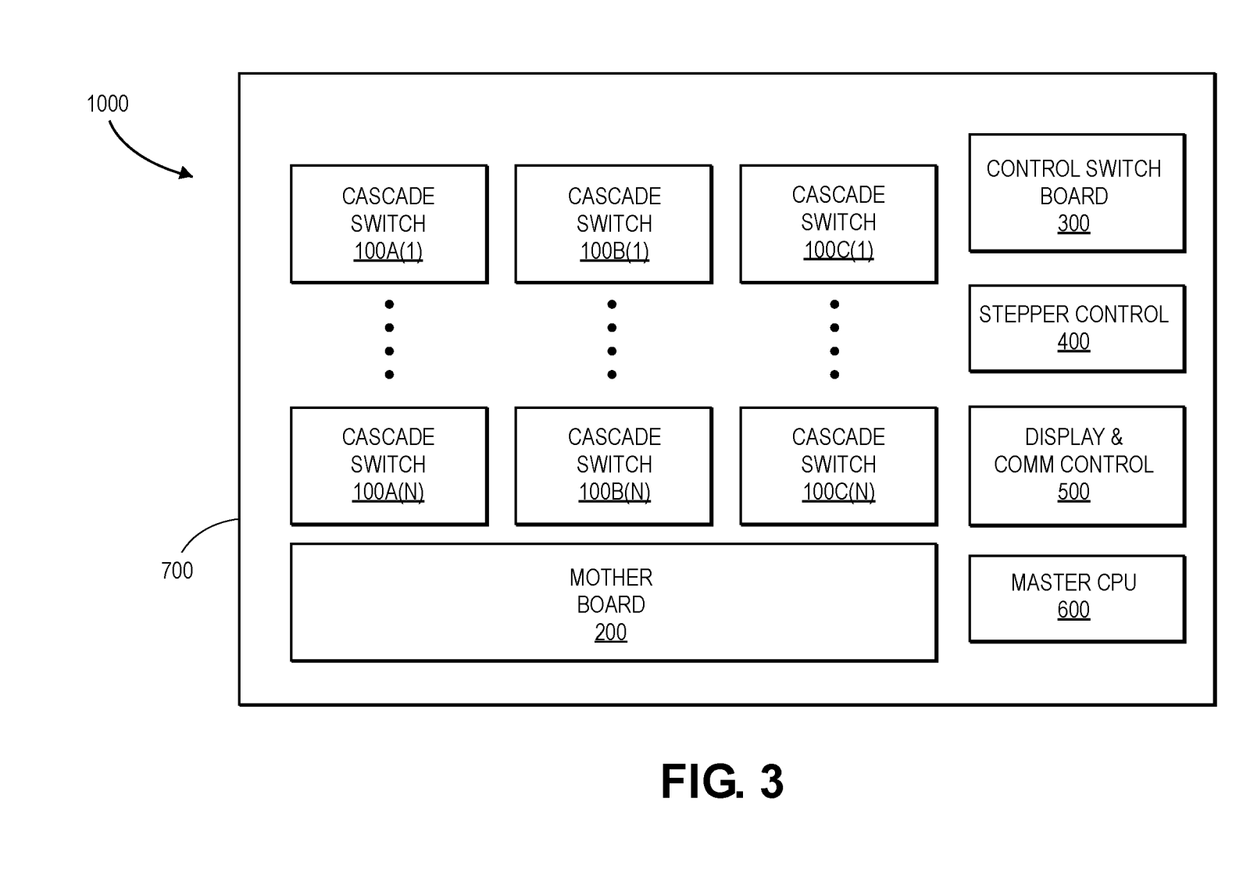
FIG. 3 is a schematic view of a motor/generator/transmission (hereinafter also known as an "MGT") control unit incorporating one or more cascade switches, such as shown in FIGS. 1 and/or 2, in accordance with an embodiment of the present disclosure.
Figure 4:
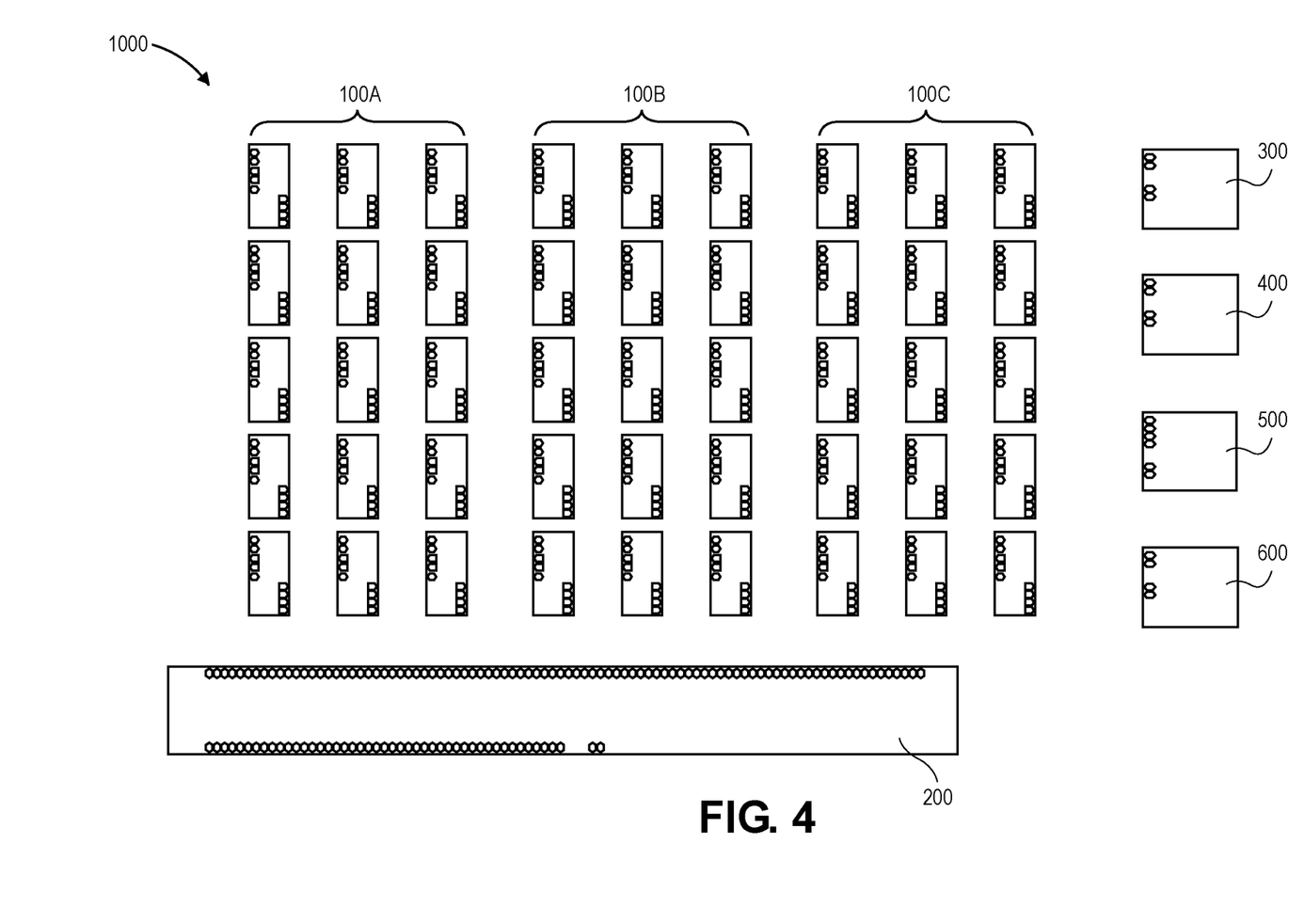
FIG. 4 is a schematic view of a motor/generator/transmission (hereinafter also known as an "MGT") control unit incorporating three arrays of cascade switches, in accordance with an embodiment of the present disclosure.

FIGS. 3 and 4 illustrate a switch controller 1000, in accordance with the present disclosure. The switch controller 1000 can include, for example, a first set or array of cascade switches 100A(1)-100A(N), a second set or array of cascade switches 100B(1)-100B(N), a third a set or array of cascade switches 100C(1)-100C(N), a mother board 200, a control switch board 300, a stepper control 400, a display and communication control unit 500, a master computer processing unit (CPU) 600, and a heat sink 700. In an embodiment, the first set of cascade switches 100A can be used for operating a first gear (not shown) of an MGT, the second set 100B for a second gear (not shown), and the third set 100C for a third gear (not shown). It is to be understood that further sets of cascade switches may be added to accommodate additional gears, if desired.

The switch controller 1000 can have a common heat sink 700 that acts as a substrate for the multiple sets of cascade switches 100A-100C. The common heat sink 700 can share the heat dissipation for the multiple sets of cascade switches 100A-100C as equally as possible. The heat sink 700 can be made of a thermally conductive material, such as copper or aluminum, and may include features, such as cooling fins, opposite its substrate side to increase its surface area and thus improve heat dissipation therefrom. Using the temperature sensors 110 associated with the cascade switch sets 100A-100C, the heat/temperature of each cascade switch 100 can be sensed. Then, using PWM, the load between them can be controlled, via the control switch board 300 and/or the master CPU 600, as to regulate the cooling time while operating at more amperage to a given MGT with smaller switches. Such system control can help keep the switch efficiency at a maximum and the component costs to a minimum. This system can thus use sets of 100-amp components that together are capable of handling thousands of amps, using both current and temperature measurements to adjust the sets of cascade switches 100A-100C, using PWM between them as a load sharing mechanism.

In an embodiment, by providing multiple cascade switch sets (e.g., 100A-100C) connected in series and/or in parallel as part of the switch controller 1000 for use with one or more MGT's, the switch controller 1000 can be used to pulse width modulate (PWM) the switching between gears. For example, with the present arrangement, it is possible to transfer power from a first gear to a second gear (e.g., powering second gear up and powering first gear down). This gradual movement is in contradistinction to an otherwise spike in current and/or revolutions per minute (RPM) that may otherwise occur when switching between gears using other power control arrangements.

By way of example, it can be possible to start the MTG at a low current and ramp up to accelerate and then switch from first gear to second gear in the series/parallel system while having a smooth transition. In this example embodiment, at first, one amp of power is applied to a given cascade switch 100, turning on the first MosFet switch 106A. As the amperage increases to eight amps, the microprocessor 102 senses this transition and sets the second parallel MosFet switch 106B to become operational. This transition can be safely done, at least in part, by the shared heat sink 107 to help prevent MosFet switch 106A, or 106B from becoming overheated. The combined first and second MosFet switches 106A, 106B can take a max amperage of up to 20 amps. Upon the amperage reaching 16 amps and accelerating, the microprocessor 102 for the cascade switch 100 can activate the 100-amp MosFet switch 106C and, for a short time, leave on the two other switches 106A, 106B at 10 amps each until the 100-amp MosFet switch 106C is completely engaged. Upon complete engagement of the 100-amp MosFet switch 106C, the first two switches 106A, 106B are deactivated (e.g., as the amperage exceeds 18 amps). Then, as the point of needing to switch from first gear on the MGT to the second gear thereof is reached, the system 1000 can switch the first gear switch set 100A to have 100% of the operation and the second gear set 100B of the MTG at 0%. While still accelerating it is possible to shift the first set 100A to 90% and the second set 100B to 10% for a short time, then change the first set 100A to 80% and the second set 100B to 20%, and so on and so forth, until the complete transition is made to thereby operate completely in second gear at 100%. This graduated shifting can enable a smooth transition from gear to gear in the MTG while still having the ability to cascade into what MosFet set that is required for the given amperage or gear set and thereby keep the system operating smoothly and efficiently.

In an embodiment, the mother board 200 can set the resistor value of the various switch sets 100A-100C as to the ID of each switch board, can provide power to the electronic components of the switch controller 1000, and can provide the connections to all the stator windings (not shown) associated with a given MGT. While mother board 200 is generally understood to be a mother board known the art of logic boards, it should be understood that any logic circuitry including integrated circuits (i.e., "chips") capable of being configured to provide the functionality listed above are also contemplated. In an embodiment, such as that shown in FIG. 4, each switch set 100A-100C may include 15 cascade switches 100, for a total of 45 cascade switches 100. However, it is to be understood that another number of switches 100 and/or switch sets 100A-100N may be employed and still be within the scope of the present disclosure.

Figure 5:
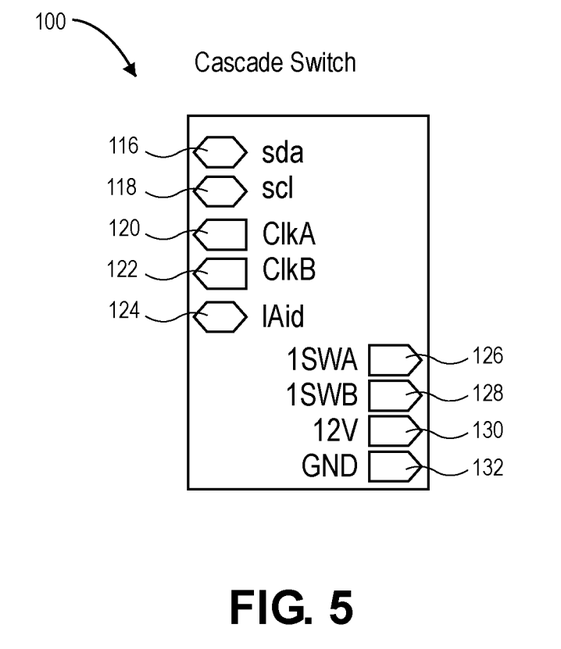
FIG. 5 is a schematic view of the given cascade switch, as shown in FIG. 4, and its electrical interconnects, in accordance with an embodiment of the present disclosure.

In an embodiment, a cascade switch board 100 can have very few connections, such as shown in FIG. 5. The cascade switch board 100 can have an sda (serial data) connection 116, an scl (serial clock) connection 118, a ClkA connection 120, a ClkB connection 122, a (1)Aid connection 124, a (1)SWA connection 126, a voltage (e.g., 12V) connection, and ground (GND) connection 132. Sda 116 and Scl 118 are part of an I2C global communication protocol/bus. Sda 116 and Scl 118 allow for each of these switch sets to know when to turn on, and they also relay temperature information to the main computer (e.g., 600) for processing. The ClkA 120 and ClkB 122 are the global clock generated by the master computer 600 and are used to PWM switch from one gear set to another, as mentioned above. The (1)Aid 124 is the analog input to each of the switch boards 100 to identify the location they are in and set a unique number for the master computer 600 to know who to enable and who to disable. It is a series of resistors (not expressly shown) that give a unique voltage that the Arduino Pro Mini looks at and sets the ID number during initialization. (1)SWA 126 and (1)SWB 128 are the actual switch connections to the stator winding (not shown) of the MGT. Power 130 and ground 132 are also provided for operations. Not shown are the one-wire bus type temperature sensors that can connect to the Arduino Pro Mini, and this info is relayed, as per the I2C bus provided.

This cascade switch board 100 can be an inexpensive parallel processing system that flows huge amount of information and control for only $2 per processor. The processor boards are plug and play as they initialize and have a unique ID as to what they switch and how they are controlled with only five wires needed to the board for communication. The microprocessor 102, when in the form of the Arduino Pro Mini, can reduce the complexity of large busses and/or wire connections.

Figure 6:
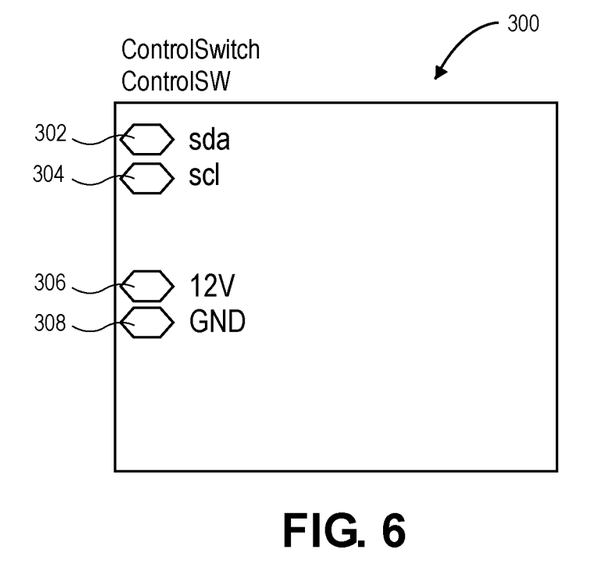
FIG. 6 is a schematic view of a control switch, as shown in FIG. 4, and its electrical interconnects, in accordance with an embodiment of the present disclosure.

In an embodiment, the control switch board 300 (FIG. 6) can include buttons and/or switches (not shown), as needed, for manual control over speed, torque, direction, gear selection, magnetic focusing, and/or menu options. All inputs can be relayed thru the I2C bus (via sda connection 302 and scl connection 304) to the Master CPU 600. The control switch board 300 can also include a power connection 306 (e.g., 12 V connection) and a ground connection 308. While switch board 300 is generally understood to be a switch board known the art, it should be understood that any logic circuitry including integrated circuits (i.e., "chips") capable of being configured to provide the functionality listed above are also contemplated.

Figure 7:
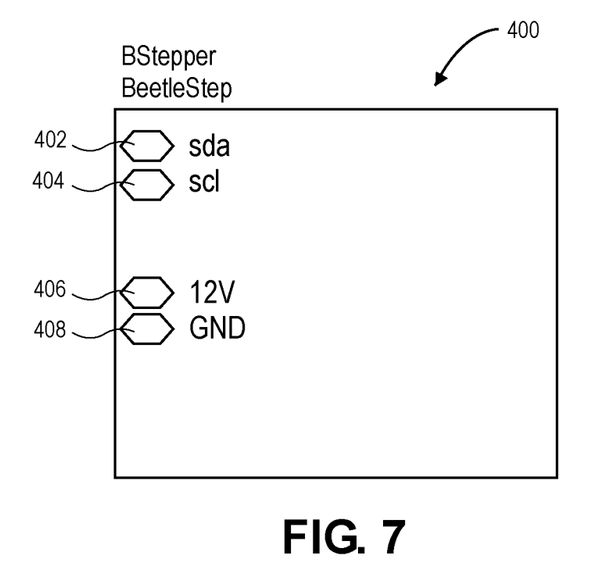
FIG. 7 is a schematic view of a stepper controller, as shown in FIG. 4, and its electrical interconnects, in accordance with an embodiment of the present disclosure.

In an embodiment, the stepper control board 400 (FIG. 7) can incorporate a Beetle Arduino processor or possibly another Pro Mini processor that can use the input from either the Master CPU 600, the manual control switch board 300 or both to actuate the magnetic focusing on both sides for rotor engagement and/or power output of the permanent magnets associated with the operation of an MGT. The stepper control board 400 can keep track of the position and percentage of engagement along with the actual steps the stepper motor(s) can make to get to the next position. To facilitate the necessary communication thereof with other system components (e.g., via an I2C bus) and/or powering thereof, the stepper control board 400 can include a sda connection 402, a scl connection 404, a power connection 406 (e.g., 12 V connection), and a ground connection 408.

Figure 8:
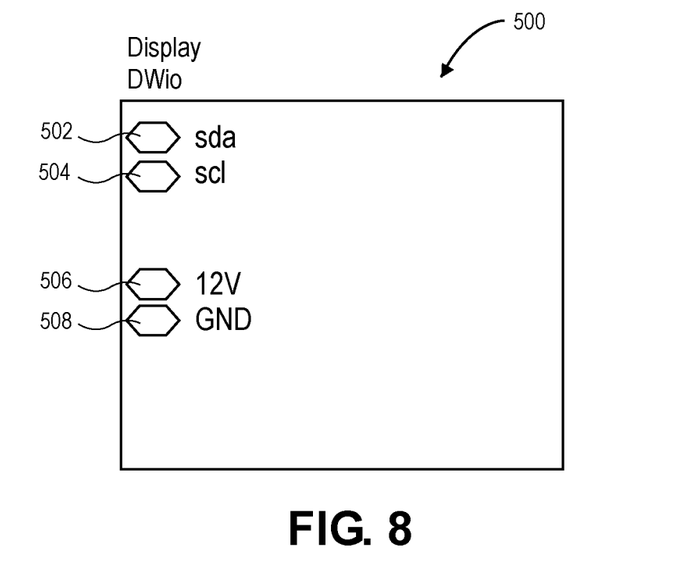
FIG. 8 is a schematic view of a display output, as shown in FIG. 4, and its electrical interconnects, in accordance with an embodiment of the present disclosure.

In an embodiment, the display and communication control unit 500, as shown in FIG. 8, can include a sda connection 502, a scl connection 504, a power connection 506 (e.g., 12 V connection), and a ground connection 508 to permit the necessary communication thereof with other system components (e.g., via an I2C bus) and/or powering thereof. The display and communication control unit 500 can be a board (not labelled) that can include a graphic display and/or a communication link (neither shown). The graphic display can give the user information and menu info. All the display functions can be given on, for example, a color LCD screen. In an embodiment, the display and communication control board 500 can define a communication link via a wireless Wio board and/or a Wifi location that can be used with a smart phone or computer with Wifi (i.e., wireless network protocol) abilities. With Wifi used, this display and communication control board 500 can also take the manual controls from the control switch board 300 and complete and/or supplement those tasks, as well. Thus, in an embodiment, the functionality of the boards 300, 500 can be combined into one board (e.g., board 500).

In an embodiment, the master CPU 600 (FIG. 9) can receive user input from either the control switch board 300 or the display Wio board 500 and can determine the gear and transitioning gear that is needed to engage. It can use the global clock to do all transitions and gear changes and, upon determining the conclusion of a full 100% gear engagement, it can send a signal to the last optional control board that can engage a respective switch 115 (e.g., a hard carbon brush switch) corresponding to each cascade switch for optimal efficiency during continued running in this gear. In an embodiment, the global clock can send a signal to the last optional control board to engage the respective switch 115 in response to the electrical load being constant for a period of time, wherein the period of time surpasses a predetermined period of time.

Figure 9:
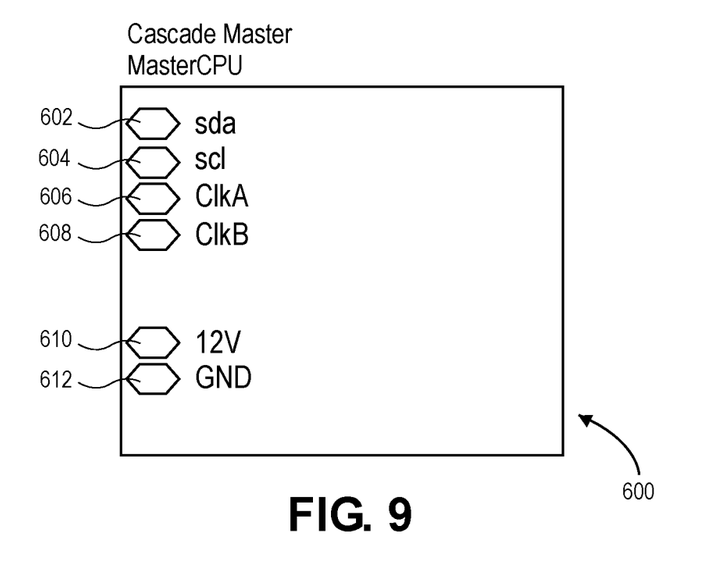
FIG. 9 is a schematic view of a master computer processor unit (CPU), as shown in FIG. 4, and its electrical interconnects, in accordance with an embodiment of the present disclosure.

The master CPU 600 can also sense and/or receive sensor data for the temperature of some or all the electronic components 100-500, as well as the motor itself (e.g., temperatures for the stator, rotor, switch boards, and coolant systems). The master CPU 600 can sense the current and anticipate the user controls as to the current needed in the speed and distance the accelerator was pressed and adjust for the transition needed in the switching amperage needed. Then, it can cascade to the most efficient MosFet switch combination while running. For example, CPU 600 can direct the electrical load to a first set of switch circuits when the temperature value corresponding to a second set of switches surpasses a threshold temperature wherein the temperature value corresponding to the first set of switch circuits is less than the threshold temperature.

All information gathered in this CPU 600 can, for example, be displayed, stored in flash drives, and/or transferred to spreadsheets, if desired. The CPU 600 can communicate with a menu-driven or web-based computer and/or phone APPs and/or be controlled therethrough. Only 4 wires and thus four connections (e.g., an sda (serial data) connection 602, an scl (serial clock) connection 604, a ClkA connection 606, and a ClkB connection 608) are needed to communicate all info, for example, to the switches, display, and controls, including the wireless controls and display.

This system 1000 can be modular and can be made redundant as to allow for military, aerospace, and/or other uses, even in case of incremental failure and still maintain running capabilities. In case of incremental stator failure this system can identify a problem wire set and remove it from use and compensate to a point using the working units until a repair can be made. All boards are hot swappable and can be plugged in and initialized while the motor is running, allowing extra and/or replacement boards to be brought online, when desired. This includes the use and function of extra master CPU boards.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. A cascade switch, comprising:
   a plurality of switch circuits coupled in parallel with each other, at least one switch circuit among the plurality of switch circuits defining a larger-load switch configured to accommodate a higher power level than at least one of the other switch circuits, wherein each respective switch circuit further comprises a metal-oxide semiconductor field-effect transistor (MosFet) and a bridge rectifier;
   an electromechanical switch coupled in parallel with the plurality of switch circuits; and
   a microprocessor operatively coupled to the plurality of switch circuits and the electromechanical switch to selectively direct an electrical load that passes through the cascade switch to at least one of the electromechanical switch and one or more switch circuits among the plurality of switch circuits, the microprocessor configured to direct the electrical load to the electromechanical switch in response to a period of time of substantially constant electrical load to reduce power losses through the cascade switch, wherein the period of time surpasses a predetermined period of time.

2. The cascade switch of claim 1, wherein each respective switch circuit comprises a dual metal-oxide semiconductor field-effect transistor (MosFet).

3. The cascade switch of claim 1, wherein each switch circuit further includes a respective opto-isolator communicatively coupled between the respective switch and the microprocessor.

4. The cascade switch of claim 1, wherein the microprocessor is configured to direct the electrical load to the larger-load switch circuit when the electrical load surpasses a threshold level.

5. The cascade switch of claim 1, wherein the microprocessor is configured to use pulse width modulation when transitioning the electrical load between the plurality of switch circuits.

6. The cascade switch of claim 5, wherein transitioning the electrical load between the plurality of switch circuits corresponds to transferring power from a first gear to a second gear.

7. The cascade switch of claim 1, further comprising an electromechanical switch operatively coupled with the microprocessor, wherein the microprocessor is configured to direct the electrical load to the electromechanical switch in response to full gear engagement.

8. The cascade switch of claim 1, wherein the microprocessor is configured to monitor a temperature value corresponding to one or more switch circuits and to direct an electrical load to one or more of the switch circuits based on the temperature value.

9. The cascade switch of claim 8, wherein the microprocessor is configured to direct the electrical load to a first set of switch circuits when the temperature value corresponding to a second set of switches surpasses a threshold temperature and the temperature value corresponding to the first set of switch circuits being less than the threshold temperature.

10. The cascade switch of claim 1, wherein the microprocessor is communicatively coupled with a manual switch, the microprocessor configured to direct an electrical load to one or more of the switch circuits based on a selection of the manual switch.

11. The cascade switch of claim 1, wherein a subset of switch circuits among the plurality of switch circuits are thermally coupled to a heatsink.

12. The cascade switch of claim 1, wherein the plurality of switch circuits are thermally coupled to a heatsink.

13. A cascade switch, comprising:
    a microprocessor;
    a plurality of switch circuits operatively coupled with the microprocessor, each respective switch circuit comprising a metal-oxide semiconductor field effect transistor (MosFet) and a bridge rectifier, at least one switch among the plurality of switches defining a larger-load switch configured to accommodate a higher power level than at least one of the other switch circuits, wherein the microprocessor is configured to monitor a power requirement and to direct an electrical load to one or more of the switch circuits based on the power requirement, wherein the microprocessor is configured to direct the electrical load to the larger-load switch circuit when the electrical load surpasses a threshold level, wherein the microprocessor is configured to use pulse width modulation when transitioning the electrical load between the plurality of switch circuits;

a plurality of opto-isolators each communicatively coupled between each respective switch and the microprocessor;

an electromechanical switch operatively coupled with the microprocessor, wherein the microprocessor is configured to direct the electrical load to the electromechanical switch in response to full gear engagement; and a heatsink, wherein the plurality of switch circuits are thermally coupled to the heatsink;

wherein the microprocessor is configured to monitor a temperature value corresponding to a first set of switch circuits and a second set of switch circuits and to direct an electrical load to the first set and the second set of the switch circuit based on the temperature value, wherein the microprocessor is configured to direct the electrical load to the first set of switch circuits when the temperature value corresponding to the second set of switches surpasses a threshold temperature and the temperature value corresponding to the first set of switch circuits being less than the threshold temperature.

14. A cascade switch, comprising:

a microprocessor;

a plurality of switch circuits operatively coupled with the microprocessor, each respective switch circuit comprising a metal-oxide semiconductor field effect transistor (MosFet) and a bridge rectifier, at least one switch among the plurality of switches defining a larger-load switch configured to accommodate a higher power level than at least one of the other switch circuits, wherein:

the microprocessor is configured to monitor a power requirement and to direct an electrical load to one or more of the switch circuits based on the power requirement, the microprocessor is configured to direct the electrical load to the larger-load switch circuit when the electrical load surpasses a threshold level, the microprocessor is configured to use pulse width modulation when transitioning the electrical load between the plurality of switch circuits, the microprocessor is configured to monitor a temperature value corresponding to a first set of switch circuits and a second set of switch circuits and to direct an electrical load to the first set and the second set of the switch circuit based on the temperature value, and the microprocessor is configured to direct the electrical load to the first set of switch circuits when the temperature value corresponding to the second set of switches surpasses a threshold temperature and the temperature value corresponding to the first set of switch circuits being less than the threshold temperature;

a manual switch communicatively coupled with the microprocessor, the microprocessor configured to direct an electrical load to one or more of the switch circuits based on a selection of the manual switch;

a plurality of opto-isolators each communicatively coupled between each respective switch and the microprocessor;

an electromechanical switch operatively coupled with the microprocessor, wherein the microprocessor is configured to direct the electrical load to the electromechanical switch in response to full gear engagement; and a heatsink, wherein a subset of switch circuits among the plurality of switch circuits are thermally coupled to a heatsink.

* * * * *